United States Patent [19]

Demmer

[11] Patent Number: 4,641,131
[45] Date of Patent: Feb. 3, 1987

[54] CIRCUIT ARRANGEMENT FOR CONVERTING A DIGITAL INPUT SIGNAL INTO AN ANALOG OUTPUT SIGNAL

[75] Inventor: Walter H. Demmer, Hamburg, Fed. Rep. of Germany

[73] Assignee: U.S. Philips Corporation, New York, N.Y.

[21] Appl. No.: 878,409

[22] Filed: Jun. 20, 1986

Related U.S. Application Data

[63] Continuation of Ser. No. 645,381, Aug. 29, 1984.

[30] Foreign Application Priority Data

Sep. 14, 1983 [DE] Fed. Rep. of Germany ....... 3333067

[51] Int. Cl.$^4$ .............................................. H03M 1/76
[52] U.S. Cl. ........................ 340/347 DA; 340/347 M; 340/347 CC
[58] Field of Search .................. 340/347 DA, 347 CC

[56] References Cited

U.S. PATENT DOCUMENTS

| | | | |
|---|---|---|---|
| 2,775,754 | 12/1956 | Sink | 340/347 DA |
| 4,281,319 | 7/1981 | Roberts, Jr. | 340/347 DA |
| 4,338,591 | 7/1982 | Tuthill | 340/347 DA |

Primary Examiner—T. J. Sloyan
Attorney, Agent, or Firm—Thomas A. Briody; Jack Oisher; William J. Streeter

[57] ABSTRACT

In a circuit arrangement for converting a digital input signal into an analog output signal, comprising a voltage divider chain which, between its ends which are supplied by at least one reference voltage, has a plurality of taps which, under the control of the digital input signal, are connectable to an output for deriving the analog output signal, a reduction in the output resistance and also an increase of the bandwidth of the analog output signal are accomplished because of the fact that any possible value of the digital input signal (B0 ... B7) connects at least two taps (A0 ... A257) of the voltage divider chain (W1 ... W257) together to the output.

8 Claims, 1 Drawing Figure

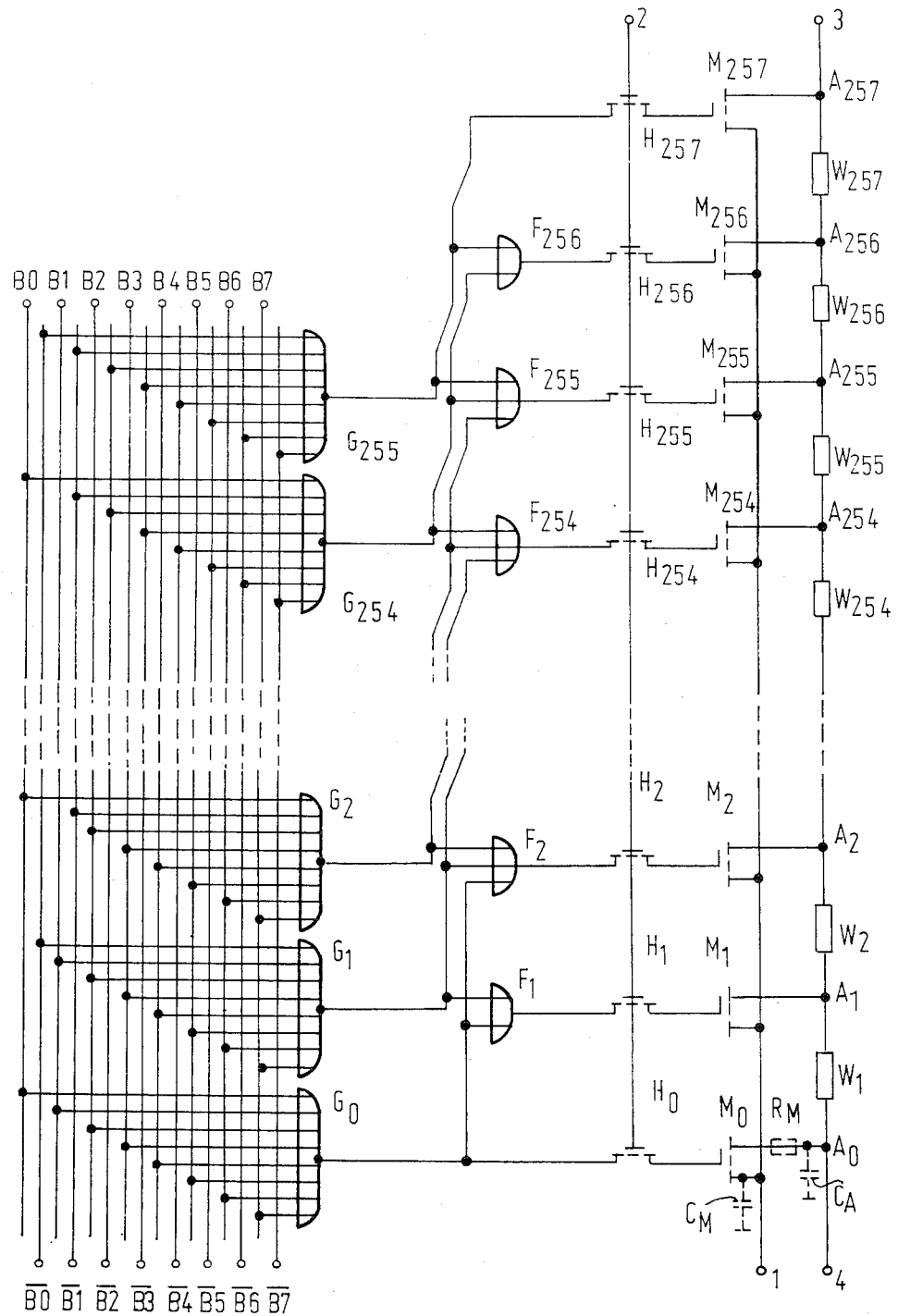

CIRCUIT ARRANGEMENT FOR CONVERTING A DIGITAL INPUT SIGNAL INTO AN ANALOG OUTPUT SIGNAL

This is a continuation of application Ser. No. 645,381, filed Aug. 29, 1984.

BACKGROUND OF THE INVENTION

The invention relates to a circuit arrangement for converting a digital input signal into an analog output signal, comprising a voltage divider chain which, arranged between its ends which are fed by at least one reference voltage source, has a plurality of taps which, under the control of the digital input signal are connectable to an output for deriving the analog output signals.

The DE-OS No. 31 26 084, more specifically FIG. 3 with its associated description, discloses a digital-to-analog converter in which a plurality of analog values are supplied by a voltage divider constituted by a series arrangement of a plurality of resistors. The sections of this voltage divider are each connected to an input electrode of a switching transistor assigned to it. The output electrodes of the switching transistors are all connected to the analog output. In addition, the converter comprises a plurality of NOR-gates of which there are as many as there are switching transistors and to whose inputs a digital input signal consisting of several parallel bits is applied. For each digital value of the digital input signal, only one of the NOR-gates produces an output value "1". The outputs of the NOR-gates are connected to the control electrodes of each of the switching transistors. Depending on the digital input signal applied, only one of the switching-transistors becomes conductive and the corresponding analog value occurs at the output.

Digital-to-analog converters of the above type are superior to other types of converters because of the high linearity of the converter characteristic and an analog signal which is free from interferences, more specifically from so-called glitches.

In the described circuit arrangement in accordance with the prior art, the analog output signal taken-off from the voltage divider is applied to the output via a switching transistor. These switching transistors have parasitic capacitances at their input and output electrodes, particularly with respect to the ground potential and also a finite contact resistance between their input and output electrodes. Particularly with the aimed-at integration of the whole circuit arrangement on a semiconductor wafer and the consequent small dimensions of the switching transistors, the contact resistances then get to be such high values that the analog output signal can only be conveyed in an extremely high resistive manner, to keep parasitic voltage drops below the limit of resolution of the analog output signal. In addition, the capacitances of the output electrodes form, together with the contact resistances, a low-pass filter arrangement which considerably limits the range of signal frequencies the circuit arrangement is capable of transmitting.

SUMMARY OF THE INVENTION

The invention has for its object to provide a circuit arrangement of the type described in the opening paragraph for converting a digital input signal into an analog output signal at whose output the analog output signal can be derived with a low-resistance value and which is operable at high frequencies.

According to the invention, this object is accomplished in that in a circuit arrangement of the type described in the opening paragraph, any possible value of the digital input signal connects at least two taps of the voltage divider chain together to the output.

Consequently, in the circuit arrangement according to the invention several connections are jointly effected between the output and the taps of the voltage divider chain by each value of the digital input signal. Conversely, each tap of the voltage divider chain is connected to the output at a plurality of values of the digital input signal. This implicates that always a plurality of connections between the taps of the voltage divider chain and the output—for example a plurality of switching transistors—are fundamentally arranged in parallel with their inherent contact resistances. As a result thereof, the whole contact resistance between the voltage divider chain and the output for the analog output signal is reduced.

It would appear that a pure reduction of the contact resistance, for example when MOS switching transistors are used, is only possible when the dimensions of the channels of such transistors are increased correspondingly. The increase in the geometrical dimensions of the transistors this would entail does however, not only prevent the desirable integration of the circuit arrangement on a semiconductor wafer but also increases the parasitic capacitances of the input and output electrodes of the transistors. These capacitances then again limit the range of useful frequencies of the analog output signals, as in the prior art.

In contrast therewith, when the circuit arrangement is implemented according to the invention, a reduction in the total contact resistance between the voltage divider chain and the output is accomplished without any significant increase in the parasitic capacitances. Thus, a low-resistive supply of the analog output signal, on the one hand, and an increase of the range of useful frequencies of the analog output signal, on the other hand, are accomplished.

In accordance with a further embodiment of the invention, the output is connected to at least two immediately adjacent taps of the voltage divider chain. When two optional taps of the voltage divider chain are first connected together to the output, the voltage divider chain portion arranged between the relative taps is shunted by the connections between the taps and the output. The number of analog output signal values which can be taken from the voltage divider chain is reduced thereby by a factor of s, s−1 being the number of taps in the shunted portion of the voltage divider chain. If the number of values of the analog-output signal must remain equal to the number of values of the digital input signal, the number of taps of the voltage divider chain must correspondingly be increased by s. The number of switchable connections between the taps and the output, that is to say, for example, the number of switching transistors, must also be increased in accordance therewith. Shunting a large portion of the voltage divider chain would consequently entail an increase in cost and designing efforts of the circuit. In addition, tolerances in the contact resistances of the connections (for example switching transistors) might cause errors in the step-values of the analog output signal. It is consequently advantageous to connect always immediately adjacent taps of the voltage divider chain to the output.

In an embodiment of the invention, the taps are connectable to the output via electronic switches. These switches are preferably in the form of MOS-transistors. Such switches require extremely low driving powers and can be produced in a simple way, so that the circuit arrangement according to the invention is very suitable for integration on a semiconductor wafer.

In accordance with a further embodiment of the invention, the voltage divider chain is formed by a number of components, which number is determined by the sum of the number of the possible values of the digital input signal and the largest distance of the voltage divider chain taps connected together to the output. Because of this measure, it is ensured that the number of adjustable values of the analog output signal is always equal to the number of possible values of the digital input signal.

In accordance with a still further embodiment of the invention, the voltage divider chain comprises ohmic resistance elements. These elements can be produced accurately and in a simple way and allow the use of direct current or voltage sources as the reference sources. Thus, parasitic impedances in the voltage divider chain structure are rendered ineffective in a simple way.

A further embodiment of the circuit arrangement according to the invention comprises a logic selection circuit which, from the digital input signal, produces control signals for switching the connections between the taps of the voltage divider chain and the output. The selection switch is preferably combined with the voltage divider chain and the switches which connect the taps to the output on a semiconductor wafer.

DESCRIPTION OF THE DRAWING

The invention will now be described in greater detail by way of example with reference to the embodiment shown in the drawing.

DESCRIPTION OF THE PREFERRED EMBODIMENT

The sole FIGURE shows, as an example of a circuit arrangement according to the invention, an 8-bit digital-to-analog converter, to which a digital input signal is applied via 8 parallel bit lines B0 to B7. The complementary input signal is furthermore applied to the circuit arrangement via 8 further, parallel bit lines $\overline{B0}$ to $\overline{B7}$. The inputs for the digital input signal and the complementary digital signal are shown separately in the FIGURE. The complementary signal can however be recovered from the input signal in known manner, using simple inverters, which are not shown for the sake of clarity, but can be simply incorporated in the circuit arrangement shown.

The lines B0 to B7 and also $\overline{B0}$ to $\overline{B7}$ are connected to inputs of 256 NOR-gates G0 to G255, in such a way that for each possible value of the digital input signals, always only one of these gates supplies an output value "1" at its output. The outputs of these gates are connected to inputs of, in this example, 256 OR-gates F1 to F256. The outputs of these OR-gates F1 to F256 are always connected to an input electrode of one out of—in this example—256 field effect transistors H1 to H256. In addition, the outputs of the first and the last NOR-gates G0 and G255 are directly connected to an input electrode of field effect transistors H0 and H257, respectively. The output electrodes of the field effect transistors H0 to H257 are connected each one to a control electrode of each of the switching transistors M0 to M257. The input electrodes of the switching transistors M0 to M257 are connected each one to a tap A0 to A257 of a voltage divider chain consisting of resistors W1 to W267. In this voltage divider chain each one of the taps A0 to A257 is arranged in each junction between, respectively the resistors W1 to W257 and the connections of the respective resistors W1 and W257 to two input terminals 3, 4.

The control electrodes of the field effect transistors H0 to H257 are interconnected and connected to a clock-pulse input 2. The connections between the NOR-gates G0 to G255 and the field effect transistors H0 to H257 and consequently the switching transistors M0 to M257 are led out via the OR-gates F1 to F256 and directly, respectively, in such manner that each output value "1" of a NOR-gate switches three contiguous switching transistors to the conductive state and consequently connects three adjacent taps of the voltage divider chain to the output 1. As a result thereof the analog value which corresponds to the digital input signal which triggers this switching state occurs at output 1. When the contact resistances of the switching transistors M0 to M257 are equal to each other, the voltage value of the analog output signal corresponds to the voltage value at the center tap of the three taps connected to the output 1.

A clock signal which inhibits all the switching transistors M0 to M257, for example during switching of the digital input signal from one value to an other, can be applied via the clock-pulse input 2. In this way interferences in the analog input signal can be suppressed.

The output terminals 3, 4 of the voltage divider chain are connected to the terminals of two reference d.c. voltage sources. Depending on the desired drive range of the analog output signal, the input terminals 3,4 can be connected to different, also negative, voltage potentials or be connected to current sources which produce corresponding voltage drops in the resistors W1 to W257.

In the FIGURE, the most important parasitic elements of such a switching transistor are shown in the example of the switching transistor M0. The capacitance CA is the parasitic capacitance of the input electrode with respect to ground potential. As it is directly connected to the tap A0 of the voltage divider chain, only a d.c. voltage is present across it, so that the capacitance CA cannot negatively affect the variation of the analog output signal.

In addition, the switching transistor M0 has between its input and its output electrode a contact resistance RM which is produced by the resistance of the transistor channel in the conductive state. Besides that, the output electrode has a parasitic capacitance CM with respect to ground potential. The parasitic elements CA, CM and RM are similarly available at all the other switching transistors M1 to M257, but are not shown in the drawing for the sake of clarity. The analog output signal is impressed on the capacitances CM of all the switching transistors. Together with the contact resistance of a conductive switching transistor, they form a low-pass filter, whose limit frequency excludes the use of the circuit arrangement at higher frequencies. By collectively switching a plurality of switching transistors to the conductive state, the limit frequency of said low-pass filter formed by the parasitic elements can be increased such that the analog output signal is no longer affected. The circuit arrangement described is consequently also suitable for converting digital signals having a higher data sequence frequency, for example digital video signals.

What is claimed is:

1. A circuit arrangement for converting a digital input signal into an analog output signal, comprising a voltage divider chain having ends, to which at least one reference source is connected, a plurality of taps arranged between the ends of said voltage divider chain, and means for connecting said taps, under control of said digital input signal, to an output at which said analog output signal is derived, characterized in that said connection means interconnects a predetermined number n of said taps, n being an integer greater than 1, and connects said interconnected taps to said output for each value of said digital input signal, whereby said analog output signal is the average value of the voltages at the taps connected by said connecting means to said output.

2. A circuit arrangement as claimed in claim 1, characterized in that said predetermined number of interconnected taps are immediately adjacent to each other.

3. A circuit arrangement as claimed in claim 1 or 2, characterized in that said connecting means comprises electronic switches for connecting said taps, respectively, to said output.

4. A circuit arrangement as claimed in claim 3, characterized in that the electronic switches are MOS-transistors.

5. A circuit arrangement as claimed in claim 1 or 2, characterized in that the voltage divider chain is formed by a number of elements arranged between said taps, which number is determined by the sum of the number of possible values of the digital input signal and the largest distance of the taps of the voltage divider chain connected collectively to the output.

6. A circuit arrangement as claimed in claim 1 or 2, characterized in that the voltage divider chain comprises ohmic resistor elements arranged between said taps.

7. A circuit arrangement as claimed in claim 1 or 2, characterized in that said connecting means comprises a logic selection circuit which, from the digital input signal, produces control signals for controlling the connection of the taps of the voltage divider chain to the output.

8. A circuit arrangement as claimed in claim 3, characterized in that said connecting means further comprises a logic selection circuit including a plurality of NOR-gates, corresponding to the number of possible values of said digital input signal, to which said digital input signal is applied, said NOR-gates being arranged so that only one of said NOR-gates provides an output signal for each of said possible values of said digital input signal, and means for connecting an output of each of said NOR-gates to a number m of said electronic switches, where the number m is equal to n.

* * * * *